United States Patent
Boemmels et al.

(10) Patent No.: US 9,859,161 B2
(45) Date of Patent: Jan. 2, 2018

(54) SELF-ALIGNED INTERCONNECTS

(71) Applicant: IMEC vzw, Leuven (BE)

(72) Inventors: Juergen Boemmels, Heverlee (BE); Zsolt Tokei, Leuven (BE); Christopher Wilson, Tervuren (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/451,175

(22) Filed: Mar. 6, 2017

(65) Prior Publication Data

US 2017/0256451 A1    Sep. 7, 2017

(30) Foreign Application Priority Data

Mar. 7, 2016   (EP) ..................................... 16158969

(51) Int. Cl.
| | | |
|---|---|---|
| *H01L 21/768* | (2006.01) | |
| *H01L 23/532* | (2006.01) | |
| *H01L 23/528* | (2006.01) | |
| *H01L 23/522* | (2006.01) | |

(52) U.S. Cl.
CPC .. *H01L 21/76897* (2013.01); *H01L 21/76816* (2013.01); *H01L 21/76819* (2013.01); *H01L 21/76829* (2013.01); *H01L 21/76846* (2013.01); *H01L 23/528* (2013.01); *H01L 23/5226* (2013.01); *H01L 23/53238* (2013.01); *H01L 23/53295* (2013.01)

(58) Field of Classification Search
CPC ........... H01L 21/76897; H01L 23/5226; H01L 23/528; H01L 23/53295; H01L 23/53238; H01L 21/76846; H01L 21/76829; H01L 21/76816; H01L 21/76819
See application file for complete search history.

(56) References Cited

U.S. PATENT DOCUMENTS

| | | | |
|---|---|---|---|
| 5,565,384 | A | 10/1996 | Havemann |
| 9,196,523 | B2 * | 11/2015 | Lin ................... H01L 21/76802 |
| 2014/0363969 | A1 | 12/2014 | Chen et al. |
| 2015/0001724 | A1 | 1/2015 | Chandhok et al. |
| 2015/0056800 | A1 | 2/2015 | Mebarki et al. |

* cited by examiner

*Primary Examiner* — David Vu
(74) *Attorney, Agent, or Firm* — Knobbe Martens Olson & Bear LLP (57) ABSTRACT

An interconnect structure and a method for forming it is disclosed. In one aspect, the method includes the steps of providing a first entity. The first entity includes a first set of line structures. The first set of line structures include a first set of conductive lines, and a first set of dielectric lines made of a first dielectric material and aligned with and overlaying the first set of conductive lines. The first entity also includes gaps separating the line structures and filled with a second dielectric material of such a nature that the first dielectric material can be selectively etched with respect to the second dielectric material. The method also includes providing a patterned mask on the first entity. The method further includes etching selectively the first dielectric material through the patterned mask so as to form one or more vias in the first dielectric material. The method also includes removing the patterned mask.

16 Claims, 8 Drawing Sheets

SELF-ALIGNED INTERCONNECTS

CROSS-REFERENCE TO RELATED APPLICATIONS

This application claims foreign priority to European Patent Application No. 16158969.2, filed Mar. 7, 2016, the contents of which are incorporated by reference herein in its entirety.

BACKGROUND

Technological Field

The present disclosure relates to the field of electrical interconnect structures and more particularly to semiconductors including such interconnect structures.

Description of the Related Technology

In the fabrication of semiconductor circuits, and more precisely in the back end of line stage of that fabrication process, different sets of conductive lines present on different levels of the device and separated by an inter-level dielectric must be interconnected. This interconnection typically involves the piercing of vias through the inter-level dielectric, the vias connecting lines of one level (bottom level) with lines of the next level (top level). Properly aligning these vias with the conductive lines they are meant to interconnect to becomes increasingly challenging as scaling advances. The misplacement of vias resulting in them overlapping with lines that they are not meant to connect to is a key reliability limiter.

The current production of electrical interconnections in semiconductors makes use of the dual-damascene fabrication process in which vias are formed at the bottom of trenches before filling the via and the trenches with a conductive material, thereby forming a via filled with a conductive material and connected to a conductive line.

Methods to align a via with a conductive line situated above the via are known in the art of dual-damascene processes. An example is disclosed in U.S. Publication No. 2014/0363969 where a method is disclosed to form via holes self-aligned with a superjacent conductive line. For this purpose, a trench-first metal hard mask sequence is used wherein a first sub-lithographic trench pattern (corresponding to the set of conductive lines to be formed) is etched into a first hardmask layer. This is followed by etching a via opening into a second hardmask layer below the first hardmask layer. The via opening in the second hardmask layer may be formed by patterning a second sub-lithographic trench pattern, otherwise referred to as a via bar pattern, across and perpendicular to the first trench. After etching, the via opening in the second hardmask layer may be formed only where the first trench and the via bar pattern intersect. The via opening may be considered self-aligned in a via bar direction by the first trench pattern in the first hardmask layer. Lastly, the via pattern may be transferred from the second hardmask into an underlying substrate including elements to which the conductive lines should be connected by the intermediate of the via. The final via opening in the substrate may also be self-aligned in a first trench direction by the second hardmask layer. Thereafter, both the via and the trenches are filled with a conductive interconnect material, thereby filling the via and forming the conductive lines. It is however to be noted that this document does not disclose how the via can be aligned with an underlying element to which the conductive lines should be connected by the intermediate of the via. Such an alignment of a via to an underlying level remains a big challenge. There is very little margin available for aligning the via with the underlying conductive line to which it is meant to connect.

There exists therefore a need in the art for methods permitting to align vias to both an underlying conductive line and a superjacent conductive line.

SUMMARY OF CERTAIN INVENTIVE ASPECTS

It is an object of the present disclosure to provide methods for forming interconnect structures enabling an alignment of a via with an underlying conductive line.

It is an advantage of embodiments of the present disclosure that an alignment of the via with the top conductive line can be achieved.

It is an advantage of embodiments of the present disclosure that a proper isolation can be provided between adjacent conductive lines.

It is a further advantage of embodiments of the present disclosure that very narrow trenches do not need to be filled in a damascene process in order to form conductive lines, thereby avoiding the gap fill constraints resulting from the use of damascene process for the 10 nm Node or smaller feature sizes. Only the via needs to be filled by a damascene process.

It is a further advantage of the present disclosure that the number of via masks required is low.

It is a further advantage of the present disclosure that an interconnect structure can be obtained which has a distance between the filling of the via and the nearest top conductive line to which it does not connect, which is larger than the distance between the top conductive line electrically connecting with the via and the nearest top conductive line not electrically connecting with the via.

The above objective is accomplished by a method and device according to the present disclosure.

In a first aspect, the present disclosure relates to a method for forming an interconnect structure, including the steps of:
a. providing a first entity including:
  i. a first set of line structures having a top surface, including:
    a first set of conductive lines,
    a first set of dielectric lines of width (w) made of a first dielectric material, aligned with and overlaying the first set of conductive lines, and comprising the top surface,
  ii. a second dielectric material of such a nature that the first dielectric material can be etched selectively with respect to the second dielectric material, the second dielectric material surrounding each line structure and having a top surface coplanar with the top surface of the line structures;
b. providing a patterned mask on the first entity, wherein the pattern includes:
  i. at least one via exposing the whole width (w) of an underlying dielectric line of the first set of dielectric lines, and/or
  ii. at least one trench exposing the whole width (w) of at least one dielectric line of the first set of dielectric lines; and
c. etching selectively the first dielectric material with respect to the second dielectric material through the patterned mask so as to form one or more vias in the first dielectric material, thereby exposing a portion of the set of conductive lines; and
d. removing the patterned mask, thereby uncovering a perforated surface.

The width of the conductive lines of the first set is typically but not obligatorily the same as the width of the dielectric lines of the first set.

In some embodiments, the width of the conductive lines of the first set may be equal or larger than the width of the dielectric lines of the first set.

That the first dielectric material can be etched selectively with respect to the second dielectric material is advantageous as it permits etching through the first dielectric material with relatively little or no etching of the second dielectric material, thereby automatically restricting the lateral extent of the via (along the cross-wise direction of the underlying lines) within the thickness of the underlying conductive line that the via connects.

In a second aspect, the present disclosure relates to an interconnect structure including:
a. a first set of line structures having a top surface, including:
i. a first set of conductive lines,
ii. a first set of dielectric lines made of a first dielectric material and aligned with and overlaying the first set of conductive lines,
b. a second dielectric material of such a nature that the first dielectric material can be etched selectively with respect to the second dielectric material, the second dielectric material surrounding each line structure and having a top surface coplanar with the top surface of the line structures, wherein the first set of dielectric lines is perforated with one or more vias exposing a portion of the first set of conductive lines.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

In the different figures, the same reference signs refer to the same or analogous elements.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein, when a first material is said to be etched selectively with respect to a second material, this means that the first material is etched faster than the second material. For instance, the etching process could etch the first material at least twice faster or at least five times faster than the second material. In some embodiments, the second material may be not etched or substantially not etched by the etching process.

A detailed description of several embodiments of the disclosure will now be described. It is clear that other embodiments of the disclosure can be configured according to the knowledge of persons skilled in the art without departing from the technical teaching of the disclosurer, the disclosure being limited only by the terms of the appended claims.

In a first aspect, the present disclosure relates to a method for forming an interconnect structure. This interconnect structure is typically formed in a semiconductor structure (e.g. an integrated circuit) to interconnect two levels of metallization. An embodiment of the method is showed in FIGS. 1 to 15.

Figure 6:
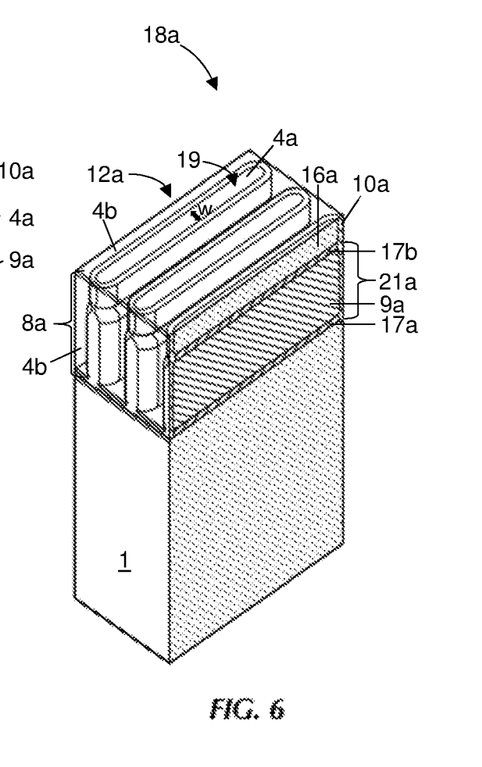

FIG. 6 shows a first entity (18a) provided by step a of a method according to an embodiment of the first aspect. This first entity (18a) including:
i. a first set of line structures (8a) having a top surface (19), including:
  a first set of conductive lines (21a),
  a first set of dielectric lines (16a) made of a first dielectric material (4a) and aligned with and overlaying the first set of conductive lines (21a), and
ii. a second dielectric material (4b) of such a nature that the first dielectric material (4a) can be etched selectively with respect to the second dielectric material (4b), the second dielectric material (4b) surrounding each line structure (8a) and having a top surface coplanar with the top surface (19) of the line structures (8a).

The first set of line structures (8a) may include one or more line structures (8a). Preferably, it includes a plurality of line structures (8a).

In embodiments, when the first set of line structures (8a) includes a plurality of line structures (8a), gaps (7) separating the line structures (8a) may be filled with the second dielectric material (4b) in such a way that the top surface of the second dielectric material (4b) is coplanar with the top surface (19) of the line structures (8a).

Preferably, the top surface of the second dielectric material (4b) and the top surface (19) of the line structures (8a) form a composite dielectric top surface (12a). This surface is preferably flat.

The second dielectric material (4b) may comprise a single material or a plurality of materials. An example where the second dielectric material (4b) may be said to comprise a plurality of materials is when a first dielectric barrier material (10a) at least entirely coats all exposed surfaces of the first set of metal lines (9a). This is best observed in FIG. 4. In that case the second dielectric material (4b) may be considered as comprising the first dielectric barrier material (10a).

In embodiments, the second dielectric material (4b) may comprise a low-k dielectric material (4b). The second dielectric material (4b) does not have to comprise a low-k material but a low-k material is preferred. This is advantageous as it reduces parasitic capacitance.

In order for the first dielectric material (4a) to be etchable selectively with respect to the second dielectric material (4b), one can for instance select the first dielectric material (4a) to be etchable by a fluorine-free, oxygen or hydrogen based plasma and select the second dielectric material (4b) not to be etchable without the presence of fluorine in the plasma.

In embodiments, the first dielectric material (4a) may be an organic polymer (optionally containing silicon) and preferably a low-k organic polymer. This is advantageous because organic polymers can be etched selectively (e.g. by using a fluorine-free, oxygen or hydrogen based plasma) with respect to second dielectric materials (4b) such as carbon-doped hydrogenated silicon oxide (SiOCH) materials (also known as organosilicate glass or OSG).

Low-k organic polymers may be but do not have to be porous. Indeed, their low k value originates from the fact that these materials mostly use low-polar bonds such as C—C, C—H and optionally Si—CH3. Preferred low-k organic polymers are aromatic.

In embodiments, the second dielectric material (4b) may be a SiOCH material. This is advantageous because such a material is not etched by fluorine-free, oxygen or hydrogen based plasma, and can therefore remain substantially unaffected during the etching of a first dielectric material (4a) comprising an organic polymer. Low-k SiOCH materials are typically made porous and can be formed by CVD (e.g. PECVD) co-deposition of a silica-like matrix together with a sacrificial organic polymer (a porogen), the latter being subsequently removed by UV-assisted thermal curing at a temperature range of 300-450° C. Some low-k porous SiOCH materials can also be deposited by spin coating. Spin coating permits a better gap fill while CVD tends to induce air gaps.

In embodiments, the first dielectric barrier material (10a) may be silicon carbon nitride (SiCN). The first dielectric barrier material (10a) is preferably deposited conformally and can for instance be deposited by CVD.

Suitable etching chemistries for the organic polymers are fluorine-free oxygen- or hydrogen-based plasma as known to the person skilled in the art. Addition of N2 (e.g. forming gas H2/N2 plasma) increases the etch rate as compared to H2/He or H2/Ar. Preferably, the plasma used is oxygen-free and is a hydrogen-based plasma. For instance the plasma used may comprise or consist of H2 and one or more of He, Ar and N2). Preferably, it comprises or consists in a H2/N2 mixture.

Suitable etching chemistries for the SiOCH and SiCN materials are fluorine based chemistries such as plasma of fluorocarbons and/or hydrofluorocarbons as known by the person skilled in the art. In embodiments, the conductive lines (21a) within the first set may be regularly spaced parallel conductive lines (21a). In embodiments, the pitch within the first set may for instance be from 20 to 30 nm although smaller or larger pitches are also within the scope of the present disclosure. In embodiments, the width of the conductive lines (21a) may be from 10 to 15 nm although narrower and broader conductive lines (21a) are also within the scope of the present disclosure. In embodiments, the thickness (height) of a conductive line (21a) may be from 20 to 30 nm although thicker and thinner conductive lines (21a) are also within the scope of the present disclosure.

In embodiments, the first set of line structures (8a) provided in step a may have the first dielectric material (4a) exposed at the top surface (19) thereof and have side surfaces (24, 25) including a conductive portion (24) and a dielectric portion (25) wherein at least the conductive portion (24) is at least partially coated with a first dielectric barrier material (10a), the first dielectric barrier material (10a) being such that the first dielectric material (4a) can be etched selectively with respect to the first dielectric barrier material (10a). Preferably, the conductive portion (24) is entirely coated with a first dielectric barrier material (10a). More preferably, the first set of line structures is entirely coated with a first dielectric barrier material (10a). Side surfaces (24, 25) of the line structures (8a) including a conductive portion (24) and a dielectric portion (25) are visible in an embodiment represented in FIG. 3 before coating with a first dielectric barrier material (10a).

In embodiments, the first entity can be provided by the method displayed from FIG. 1 to FIG. 6.

Figure 1:
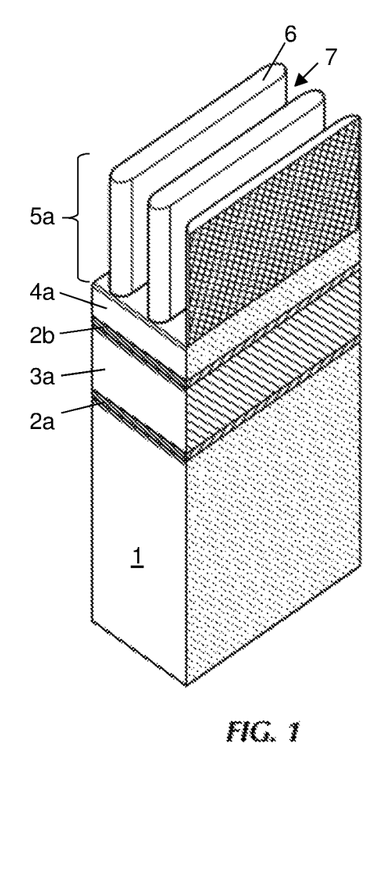
FIGS. 1-15 show by a series of vertically cross-sectioned perspective views, successive steps of an embodiment of the present disclosure.

We are now referring to FIG. 1.

Figure 2:
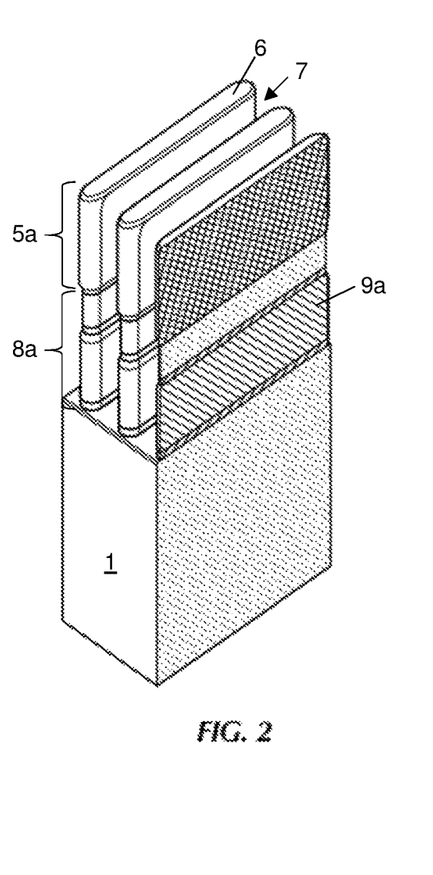
Figure 3:
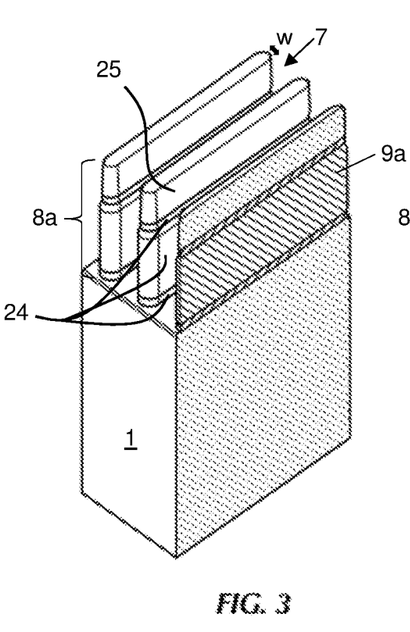
Figure 4:
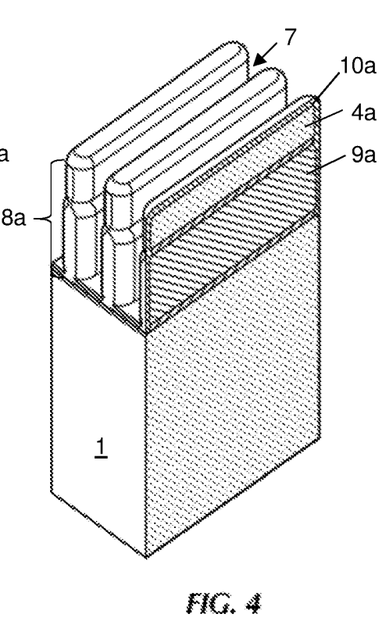
Figure 5:
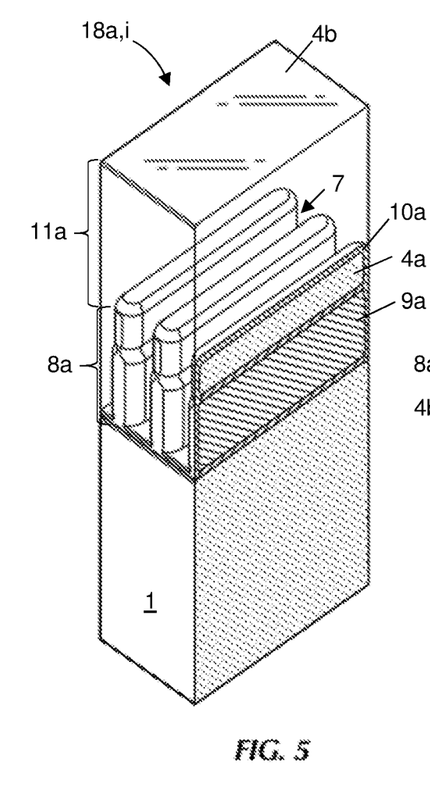

In these embodiments, providing the first entity (18a) may include the steps of:
- a1. providing a substrate (1);
- a2. optionally overlying the substrate (1) with a first diffusion barrier layer (2a);
- a3. overlying a first metal layer (3a) on the first diffusion barrier layer (2a) if present or on the substrate (1) if no first diffusion barrier layer (2a) is present;
- a4. optionally overlying the first metal layer (3a) with a second diffusion barrier layer (2b);
- a5. overlying a layer of a first dielectric material (4a) on the second diffusion barrier layer (2b) if present or on the first metal layer (3a) if no second diffusion barrier layer (2b) is present;
- a6. providing a first patterned mask (5a) on the layer of a first dielectric material (4a), wherein the pattern includes one or more lines (6). Preferably, the pattern of lines includes a plurality of lines (6) separated by gaps (7); the resulting structure is depicted in FIG. 1. The structure resulting from the next step a7 is depicted in FIG. 2;
- a7. etching the layer of a first dielectric material (4a), the second diffusion barrier layer (2b) if present, the first metal layer (3a), and the first diffusion barrier layer (2a) if present, through the first patterned mask (5a), thereby forming a first set of line structures (8a) (separated by gaps (7) if more than one line structure (8a) is present), the first set of line structures (8a) including a first set of metal lines (9a); the structure resulting from the next step a8 is depicted in FIG. 3;
- a8. removing the first patterned mask (5a); the structure resulting from the next step a9 is depicted in FIG. 4;
- a9. optionally coating the first set of line structures (8a) with a first dielectric barrier material (10a) so as to at least entirely coat all exposed surfaces of the first set of metal lines (9a) of the first set of line structures (8a), the first dielectric barrier material (10a) being such that the first dielectric material (4a) can be etched selectively with respect to the first dielectric barrier material (10a); the structure resulting from the next step a10 is depicted in FIG. 5;
- a10. overlaying the first set of line structures (8a) and the first dielectric barrier material (10a) if present with a second dielectric material (4b) in such a way as to cover entirely the first set of line structures (8a) and the first dielectric barrier material (10a) if present, wherein the second dielectric material (4b) is such that the first dielectric material (4a) can be etched selectively with respect to the second dielectric material (4b), thereby providing an intermediate first entity (18a,i); If more than one line structures (8a) is present, the second dielectric material (4b) preferably fills in the gaps (7) between the line structures (8a); the structure resulting from the next step a11 is depicted in FIG. 6;
- a11. planarizing the intermediate first entity (18a,i) by removing a top portion (11a) thereof in such a way that the first dielectric material (4a) is exposed, thereby providing the first entity (18a).

In some embodiments, the metal layer (3a) and the resulting metal lines (9a) may be in copper. A diffusion barrier (2a, 2b) is particularly useful when the metal is copper.

The diffusion barrier materials (2a) and (2b) in contact with copper are preferably selected in such a way that they prevent diffusion of copper therethrough. This is advantageous as it prevents copper from diffusing to adjacent structures. The diffusion barrier materials (2a, 2b) is preferably a conductive material but it does not have to be. They may for instance be made of TaN.

Figure 8:
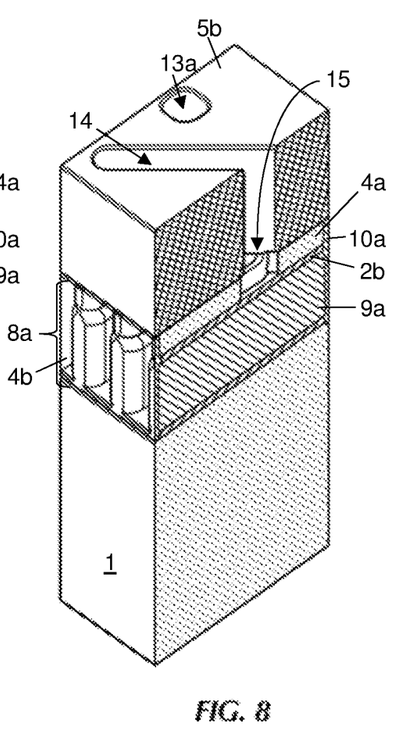

We now refer to FIG. 8.

In step b, a patterned mask (5b) is provided on the first entity (18a), wherein the pattern may include:
- i. at least one via (13a) exposing the whole width (w) of an underlying dielectric line (16a) of the first set of dielectric lines (16a), and/or
- ii. at least one trench (14) exposing the whole width (w) of at least one underlying dielectric line (16a) of the first set of dielectric lines (16a).

Figure 9:
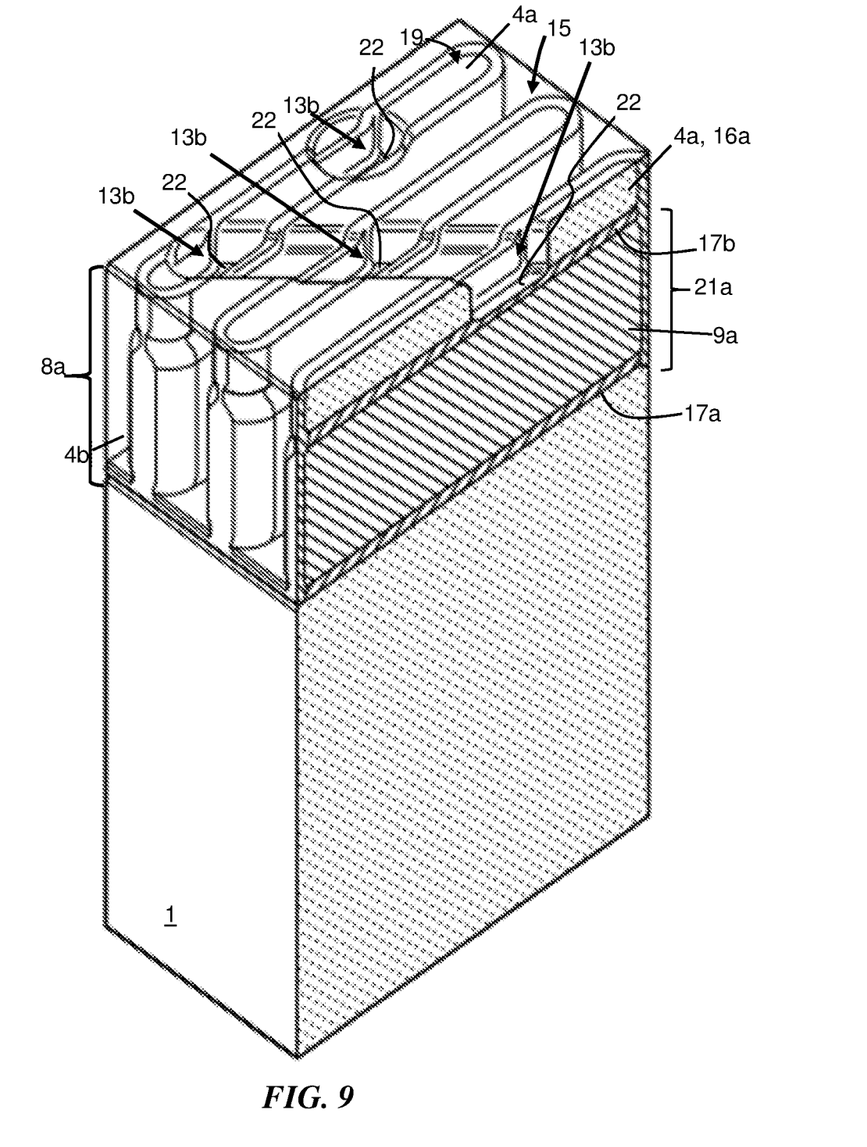

We now refer to FIG. 9 which shows the structure resulting from the combination of steps c and d.

In step c, the first dielectric material (4a) is etched selectively through the patterned mask (5b) so as to form one or more vias (13b) in the first dielectric material (4a), thereby exposing a portion (22) of the set of conductive lines (21a), In embodiments, when the first set of conductive lines (21a) includes:
optionally a first set of diffusion barrier lines (17a),
a first set of metal lines (9a) aligned with and overlaying the first set of diffusion barrier lines (17a) if present, and
optionally a second set of diffusion barrier lines (17b) aligned with and overlaying the first set of metal lines (9a),
wherein the first set of dielectric lines (16a) is aligned with and overlaying the second set of diffusion barrier lines (17b) if present or the first set of metal lines (9a) in absence of the second set of diffusion barrier lines (17b),
step c may expose a portion (22) of the second set of diffusion barrier lines (17b) if present or a portion of the first set of metal lines (9a) in absence of the second set of diffusion barrier lines (17b).

In step d, the patterned mask (5b) is removed, thereby uncovering a perforated surface (15).

In embodiments, the patterned mask (5b) may be removed during the selective etching of the first dielectric material (4a). In this embodiment, steps c and d are a single step.

Figure 15:
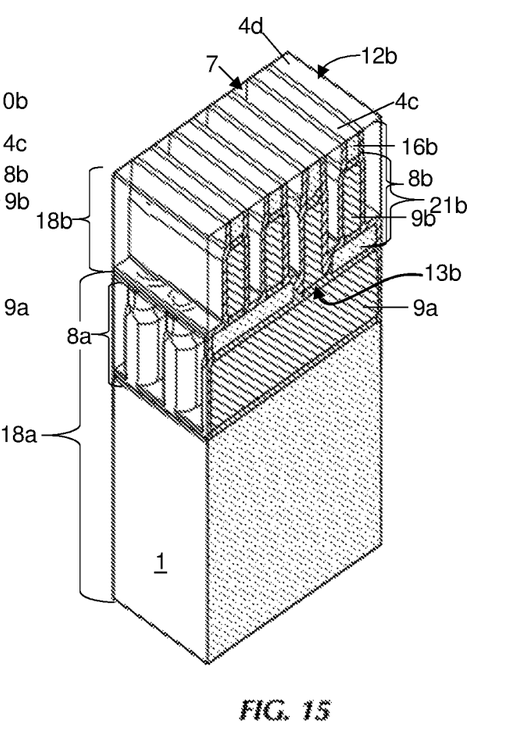

In embodiments, the method of the first aspect may further include step e of providing a second entity (18b) on the first entity (18a). An embodiment where such a second entity is being provided is depicted in FIG. 7-15. We now refer to FIG. 15. The second entity includes:
a second set of one or more line structures (8b) (preferably a plurality) at an angle (preferably perpendicular) relative to the first set of line structures (8*a*), wherein at least one of the line structures (8*b*) is aligned with at least one of the one or more vias (13*b*) and penetrating the at least one of the one or more vias (13*b*) so as to connect with the exposed portion (22) of the first set of conductive lines (21*a*), the second set of line structures (8*b*) including:

a second set of conductive lines (21*b*) wherein at least one of the conductive lines (21*b*) is aligned with at least one of the one or more vias (13*b*) and penetrating at least one of the one or more vias (13*b*),     a second set of dielectric lines (16*b*) made of a third dielectric material (4*c*) and aligned with and overlaying the second set of conductive lines (21*b*),     a fourth dielectric material (4*d*) of such a nature that the third dielectric material (4*c*) can be etched selectively with respect to the fourth dielectric material (4*d*), the fourth dielectric material (4*d*) surrounding each line structure and having a top surface coplanar with the top surface of the line structures.

In embodiments, when the second set of line structures (8*b*) includes a plurality of line structures (8*b*), gaps (7) separating the line structures (8*b*) may be filled with the fourth dielectric material (4*d*) in such a way that the top surface of the fourth dielectric material (4*d*) is coplanar with the top surface of the line structures (8*b*). Preferably, the top surface of the fourth dielectric material (4*d*) and the top surface of the line structures (8*b*) form a composite dielectric top surface (12*b*). This surface is preferably flat.

In embodiments, the third dielectric material may be selected from the materials herein indicated as suitable for the first dielectric material. For instance, the third dielectric material may comprise the same material as the first dielectric material.

In embodiments, the fourth dielectric material may be selected from the materials herein indicated as suitable for the second dielectric material. For instance, the fourth dielectric material may comprise the same material as the second dielectric material.

Figure 10:
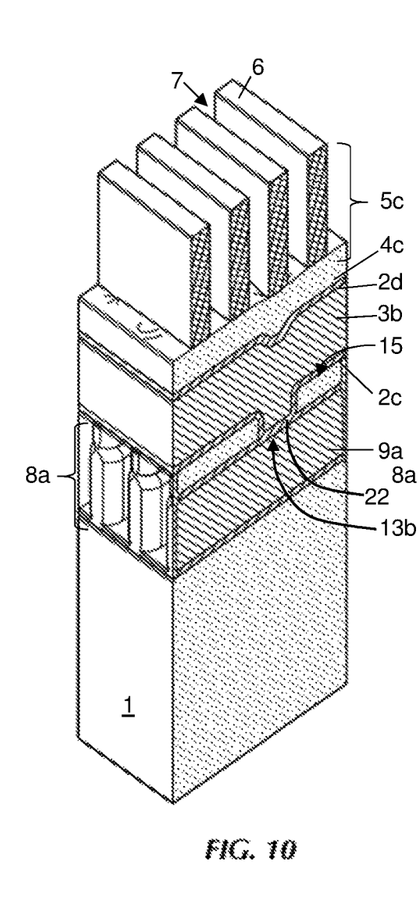
Figure 11:
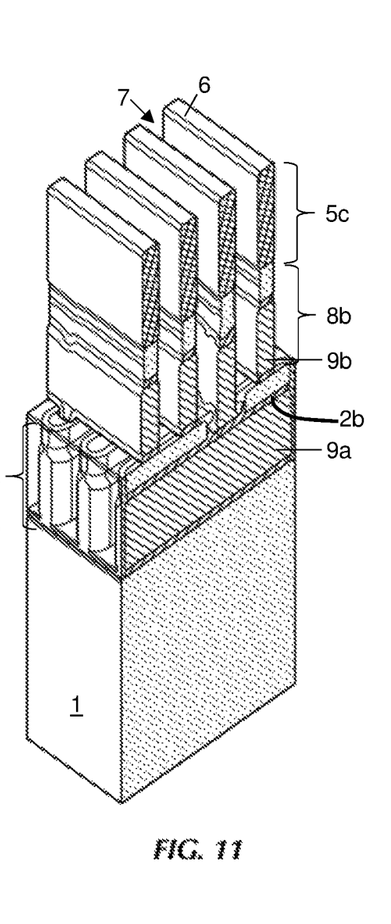
Figure 12:
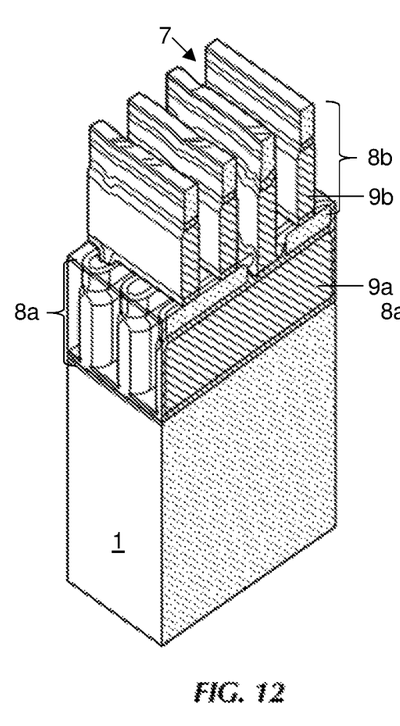
Figure 13:
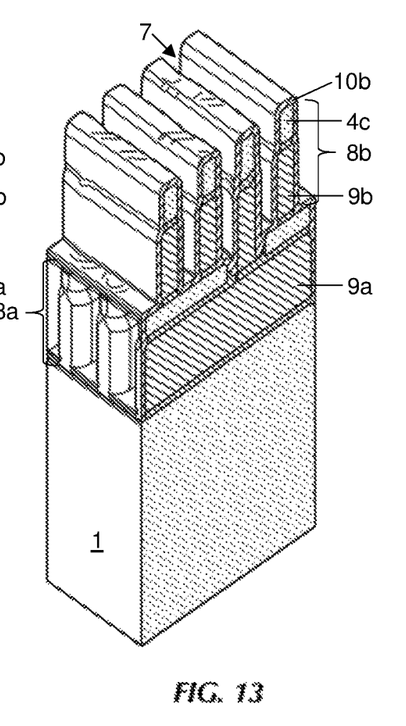
Figure 14:
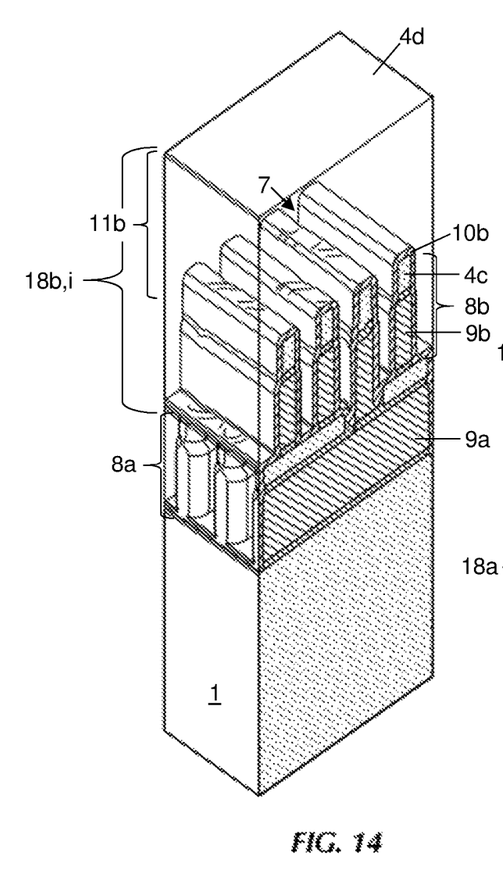

In embodiments, step e may include the steps of:

e1. optionally overlying the perforated surface (15) with a third diffusion barrier layer (2*c*) penetrating the one or more vias (13*b*) and connecting with the exposed portion (22) of the first set of conductive lines (21*a*);

e2. overlying a second metal layer (3*b*) on the third diffusion barrier layer (2*c*) if present or on the perforated surface (15), so as to fill the one or more vias (13*b*) and connect with the exposed portion (22) of the first set of conductive lines (21*a*);

e3. optionally overlying the second metal layer (3*b*) with a fourth diffusion barrier layer (2*d*);

e4. overlying a layer of a third dielectric material (4*c*) on the fourth diffusion barrier layer (2*d*) if present or on the second metal layer (3*b*) if no fourth diffusion barrier layer (2*d*) is present,     e5. providing a third patterned mask (5*c*) on the layer of a third dielectric material (4*c*), wherein the pattern includes one or more lines (6) (if more than one line (6), they are separated by gaps (7)), wherein the lines (6) are at an angle (preferably perpendicular) relative to the first set of line structures (8*a*), wherein at least one of the line structures (8*b*) is aligned with at least one of the one or more vias (13*b*); the structure resulting from this step is depicted in FIG. 10;

e6. etching the layer of a third dielectric material (4*c*), the fourth diffusion barrier layer (2*d*) if present, the second metal layer (3*b*), and the third diffusion barrier layer (2*c*) if present, through the third patterned mask (5*c*), thereby forming the second set of line structures (8*b*) separated by gaps (7); the structure resulting from this step is depicted in FIG. 11;

e7. removing the third patterned mask (5*c*); the structure resulting from this step is depicted in FIG. 12;

e8. optionally coating the second set of line structures (8*b*) with a second dielectric barrier material (10*b*) so as to at least entirely coat all exposed surfaces of the second set of conductive lines (21*b*) (e.g. by coating all exposed surfaces of the second set of line structures (8*b*), the second dielectric barrier material (10*b*) being such that the third dielectric material (4*c*) can be etched selectively with respect to the second dielectric barrier material (10*b*); the structure resulting from this step is depicted in FIG. 13;

e9 overlaying the second set of line structures (8*b*) and the second dielectric barrier material (10*b*) if present with a fourth dielectric material (4*d*) in such a way as to as to cover entirely the second set of line structures (8*b*) and the second dielectric barrier material (10*b*) if present (and as to fill the gaps (7) if more than one line structure (8*b*) is present), wherein the fourth dielectric material (4*d*) is such that the third dielectric material (4*c*) can be etched selectively with respect to the fourth dielectric material (4*d*); thereby providing an intermediate second entity (18*b,i*); the structure resulting from this step is depicted in FIG. 14;

e10. planarizing the intermediate second entity (18*b,i*) by removing a top portion (11*b*) thereof in such a way that the third dielectric material (4*c*) is exposed, thereby providing the second entity (18*b*); the structure resulting from this step is depicted in FIG. 15.

In step e2, contrarily to the dual damascene process typical of the prior art, only a via needs to be filled by the metal layer (3*b*) instead of a combination of a via and a trench. This is much easier.

In embodiments, the second metal layer (3*b*) may comprise a material described as suitable for the first metal layer (3*a*). For instance, the second metal layer (3*b*) may comprise the same material as the first metal layer (3*a*).

In embodiments, the second dielectric barrier material (10*b*) may comprise a material described as suitable for the first dielectric barrier material (10*a*). For instance, the second dielectric barrier material (10*b*) may comprise the same material as the first dielectric barrier material (10*a*).

In embodiments, the dielectric material (4*a*) may etch more slowly than the second metal layer (3*b*) in the etching conditions of step e6. This is advantageous as it avoids damaging the dielectric material (4*a*) which is on top of the first set of metal lines (9*a*).

In embodiments, the top surface of the layer of dielectric material (4*c*) may present a concave indentation vertically aligned with the via (13*b*). This will be typically the case if the combined thicknesses of the second metal layer (3*b*) and of the layer of dielectric material (4*a*) is not sufficient to compensate for the profile of the via (13*b*). Such an indentation has the advantage of facilitating alignment of the lines (6) of the third patterned mask (5*c*) with the via (13*b*). This indent can be used to position the lines (6) of the third patterned mask (5*c*) so that they, and the metal lines (9*b*) will be aligned with that indent and therefore with the via (13*b*).

In step e6, it is advantageous to continue the etching until it reaches below the top of the via (13*b*). For instance, the etching can continue until the bottom of the via (13*b*) is exposed. The bottom of the via (13*b*) typically corresponds to the portion (22) of the first set of conductive lines (21*a*) that was exposed during step c. By etching until the etching reaches below the top of the via (13*b*), we make sure that the second metal layer (3b) is removed everywhere but in the via (13b). This makes sure that the conductive lines (9b) do not remain accidentally connected with one another.

In embodiments, the extent of the via (13b) along the longitudinal direction of the conductive lines of the first set (21a) may be greater than the width of the conductive line of the second set (21b) penetrating the via (13b). That way, the conductive lines of the second set (21b) easily fall (with a margin on each side of the conductive line of the second set (21b) corresponding to half of the difference between the extent of the via (13b) and the width of the conductive line of the second set (21b)) in the via (13b) after patterning of the second set of line structures (8b). This is advantageous because, if the etching reaches below the top of the via (13b) and the bottom of the conductive line of the second set (21b) penetrating the via (13b) is at a lower level than the bottom of the neighboring lines of the second set (21b) (not penetrating said via (13b)), the distance between the these two conductive line bottoms is greater than if they were at a same level. This further increases the isolation between the filling of the via (13b) and the conductive lines of the second set (21b) not aligned with the via (13b).

In embodiments, the extent of the via (13b) along the longitudinal direction of the conductive lines of the first set (21a) may be smaller than twice the pitch of the conductive lines of the second set (21b), minus the width of the conductive lines of the second set (21b) penetrating the via (13b). It is advantageous if the via (13b) is not too long because otherwise a conductive line of the second set (21b) adjacent to the conductive line of the second set (21b) connected to the via (13b) could find itself aligned with the via (13b).

The extent of the via (13b) along the cross-wise direction of the conductive lines of the first set (21a) is typically equal to (or eventually smaller than) the width of the conductive lines of the first set (21a). They are typically not larger because of the selective etching process, permitting self-alignment.

In embodiments, leaving airgaps during the formation of the second dielectric material (4b) or of the fourth dielectric material (4d) overlay is not detrimental, as long as airgaps do not deform the top surface of the respective dielectric materials (4b, 4d)

In embodiments of the present disclosure, the metal may be copper and all optional steps may be mandatory.

In embodiments of the present disclosure, the second set of line structures (8b) may be perpendicular to the first set of line structures (8a).

In embodiments, in step e6, the etching through the second metal layer (3b) and the third diffusion barrier layer (2c) if present may be continued until:
a. away from the one or more vias (13b), it exposes either
  i. the top surface of the second dielectric material (4b) underlying the second metal layer (3b), or
  ii. the third diffusion barrier layer (2c) if present; and
b. in the one or more vias (13b), it reaches below the top of the via (13b) (e.g. it may go as far as to expose the second barrier layer (2b) if present or a metal line (9a)).

In embodiments, the entity (18a) may have a composite dielectric top surface (12a), wherein the first set of line structures (8a) has a top surface (19), wherein the gaps (7) are filled to the level of the top surface (19) with the second dielectric material (4b), thereby forming the composite dielectric top surface (12a) including the top surface (19) and the top surface of the second dielectric material filling (4b).

In a second aspect, the present disclosure relates to an interconnect structure including:
a. a first set of (one or more) line structures (8a) having a top surface (19), including:
  i. a first set of (one or more) conductive lines (21a),
  ii. a first set of (one or more) dielectric lines (16a) made of a first dielectric material (4a) and aligned with and overlaying the first set of conductive lines (21a),
b. a second dielectric material (4b) of such a nature that the first dielectric material (4a) can be etched selectively with respect to the second dielectric material (4b), the second dielectric material (4b) surrounding each line structure (8a) and having a top surface coplanar with the top surface (19) of the line structures, wherein the first set of dielectric lines (16a) is perforated with one or more vias (13b) exposing a portion (22) of the first set of conductive lines (21a).

In embodiments, the interconnect structure may include:
a. a first set of line structures (8a) including:
i. a first set of more than one conductive lines (21a),
ii. a first set of dielectric lines (16a) made of a first dielectric material (4a) and aligned with and overlaying the first set of conductive lines (21a),
b. gaps (7) separating the line structures (8a) and filled with a second dielectric material (4b) of such a nature that the first dielectric material (4a) can be etched selectively with respect to the second dielectric material (4b), wherein the first set of dielectric lines (16a) is perforated with one or more vias (13b) exposing a portion (22) of the first set of conductive lines (21a).

In embodiments, the first set of conductive lines (21a) may include:
a. optionally a first set of diffusion barrier lines (17a),
b. a first set of metal lines (9a), and
c. optionally a second set of diffusion barrier lines (17b),
wherein when the first set of diffusion barrier lines (17a) is present, it is aligned with and overlaid by the first set of metal lines (9a), wherein the second set of diffusion barrier lines (17b) if present is aligned with and is overlying the first set of metal lines (9a), wherein the first set of dielectric lines (16a) is aligned with and is overlying the second set of barrier lines (17b) if present or the first set of metal lines (9a) in absence of the second set of barrier lines (17b), wherein the first set of dielectric lines (16a) is perforated with one or more vias exposing a portion (22) of the first set of conductive lines (21a).

In embodiments, the first set of line structures (8a) may have the first dielectric material (4a) exposed at the top surface (19) thereof and have side surfaces (24, 25) including a conductive portion (24) and a dielectric portion (25), wherein at least part of the conductive portion (24) has a coating of a first dielectric barrier material (10a) thereon, the first dielectric barrier material (10a) being such that the first dielectric material (4a) can be etched selectively with respect to the first dielectric barrier material (10a).

In embodiments, wherein the first set of line structures (8a) may be coated with the dielectric barrier material (10a) so as to at least entirely coat all exposed surfaces of the first set of metal lines (9a).

In embodiments, the interconnect structure may further include a second set of one or more line structures (8b) at an angle relative to the first set of line structures (8a), wherein at least one of the line structures of the second set (8b) is aligned with at least one of the one or more vias (13b) and penetrating the one of the one or more vias (13b) so as to (electrically) connect with the exposed portion (22) of the first set of conductive lines (21a), the line structures (8b)

being separated by gaps (7) if more than one line structure (8b) is present in the second set, the second set of one or more line structures (8b) including:
  i. a second set of one or more conductive lines (21b) penetrating the one or more vias (13b), and
  ii. a second set of one or more dielectric lines (16b) made of a third dielectric material (4c) and aligned with and overlaying the second set of conductive lines (21b).

The interconnect structure further includes a fourth dielectric material (4d) of such a nature that the third dielectric material (4c) can be etched selectively with respect to the fourth dielectric material (4d), the fourth dielectric material (4b) surrounding each line structure (8b) and having a top surface coplanar with the top surface of the line structures (8b) of the second set.

In embodiments, the metal may be copper and all optional features may be mandatory.

In embodiments, the second set of line structures (8b) may be perpendicular to the first set of line structures (8a).

The following is an example of method according to an embodiment of the present disclosure. We now refer to FIGS. 1-15.

Figure 7:
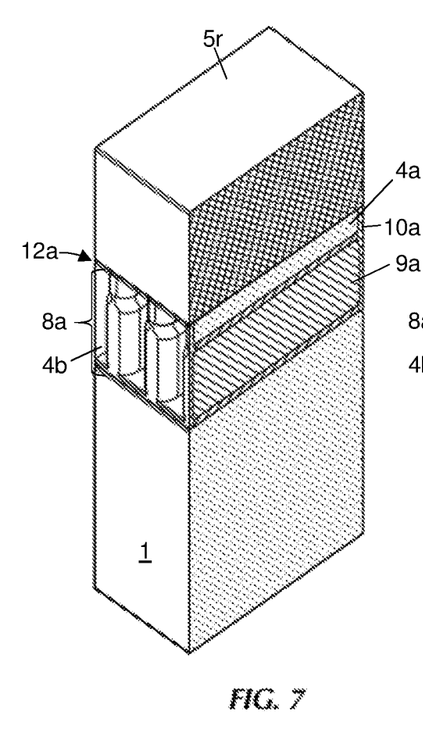

A via (13b) is aligned with an underlying metal line in a semiconductor structure by performing the following steps:
  a. providing a substrate (1);
  b. optionally overlying the substrate (1) with a first diffusion barrier layer (2a);
  c. overlying a first metal layer (3a) on the first diffusion barrier layer (2a) if present or on the substrate (1) if no first diffusion barrier layer (2a) is present;
  d. optionally overlying the first metal layer (3a) with a second diffusion barrier layer (2b);
  e. overlying a layer of a first dielectric material (4a) on the second diffusion barrier layer (2b) if present or on the first metal layer (3a) if no second diffusion barrier layer (2b) is present;
  f. providing a first patterned mask (5a) on the layer of a first dielectric material (4a), wherein the pattern includes lines (6) separated by gaps (7); the resulting structure is depicted in FIG. 1;
  g. etching the layer of a first dielectric material (4a), the second diffusion barrier layer (2b) if present, the first metal layer (3a), and the first diffusion barrier layer (2a) if present, through the first patterned mask (5a), thereby forming a first set of line structures (8a) separated by gaps (7), the first set of line structures (8a) including a first set of metal lines (9a); the resulting structure is depicted in FIG. 2;
  h. removing the first patterned mask (5a); the resulting structure is depicted in FIG. 3;
  i. optionally coating the line structures with a first dielectric barrier material (10a) so as to at least entirely coat all exposed surfaces of the first set of metal lines (9a), the first dielectric barrier material (10a) being such that the first dielectric material (4a) can be etched selectively with respect to the first dielectric barrier material (10a); the resulting structure is depicted in FIG. 4;
  j. overlaying the first set of line structures (8a) and the first dielectric barrier material (10a) if present with a second dielectric material (4b) in such a way as to fill the gaps (7) and as to cover entirely the first set of line structures (8a) and the first dielectric barrier material (10a) if present, wherein the second dielectric material (4b) is such that the first dielectric material (4a) can be etched selectively with respect to the second dielectric material (4b); the resulting structure is depicted in FIG. 5;
  k. planarizing the second dielectric material (4b) by removing a top portion (11a) thereof in such a way that the first dielectric material (4a) is exposed, thereby providing a planarized surface (12a); this is depicted in FIG. 6;
  l. providing a second patterned mask (5b) on the planarized surface (12a), wherein the pattern includes at least one via (13a) vertically aligned with an underlying metal line (9a) of the first set and/or at least one trench (14) forming an angle with at least one underlying metal line (9a) of the first set; this step can be decomposed in a first sub-step of providing a masking material (5r) having a flat surface (such as a flat photoresist layer (5r), this is depicted in FIG. 7), followed by patterning the masking material (by for instance exposing and developing the flat photoresist layer (5r)); the resulting structure is depicted in FIG. 8;
  m. etching selectively the first dielectric material (4a) through the second patterned mask (5b) so as to form one or more vias (13b) in the first dielectric material (4a), thereby exposing a portion of the second diffusion barrier layer (2b) if present or a portion of the first set of metal lines (9a) if no second diffusion barrier layer (2b) is present, thereby forming a perforated dielectric surface (15);
  n. removing the second patterned mask (5b); the resulting structure is depicted in FIG. 9;
  o. optionally overlying the perforated dielectric surface (15) with a third diffusion barrier layer (2c);
  p. overlying a second metal layer (3b) on the third diffusion barrier layer (2c) if present or on the perforated dielectric surface (15) if no third diffusion barrier layer (2c) is present;
  q. optionally overlying the second metal layer (3b) with a fourth diffusion barrier layer (2d);
  r. overlaying a layer of a third dielectric material (4c) on the fourth diffusion barrier layer (2d) if present or on the second metal layer (3b) if no fourth diffusion barrier layer (2d) is present;
  s. providing a third patterned mask (5c) on the layer of a third dielectric material (4c), wherein the pattern includes lines (6) separated by gaps (7), wherein the vertical projection of the lines (7) on the first set of metal lines (9a) is at an angle therewith; the resulting structure is depicted in FIG. 10;
  t. etching the layer of a third dielectric material (4c), the fourth diffusion barrier layer (2d) if present, the second metal layer (3b), and the third diffusion barrier layer (2c) if present, through the third patterned mask (5c), thereby forming a second set of line structures (8b) separated by gaps (7), the second set of line structures (8b) including a second set of metal lines (9b), wherein the vertical projection of this second set of metal lines (9b) on the first set of metal lines (9a) is at an angle therewith; the resulting structure is depicted in FIG. 11;
  u. removing the third patterned mask (5c); the resulting structure is depicted in FIG. 12;
  v. optionally coating the second set of line structures (8b) with a second dielectric barrier material (10b) so as to at least entirely coat all exposed surfaces of the second set of metal lines (9b), the second dielectric barrier material (10b) being such that the third dielectric material (4c) can be etched selectively with respect to the second dielectric barrier material (10b); the resulting structure is depicted in FIG. 13;
  w. overlaying the second set of line structures (8b) and the second dielectric barrier material (10b) if present with a fourth dielectric material (4d) in such a way as to fill the gaps (7) and as to cover entirely the second set of line structures (8b) and the second dielectric barrier material (10b) if present, wherein the fourth dielectric material (4d) is such that the third dielectric material (4c) can be etched selectively with respect to the fourth dielectric material (4d); the resulting structure is depicted in FIG. 14;

x. planarizing the fourth dielectric material (4d) by removing a top portion (11b) thereof in such a way that the third dielectric material (4c) is exposed, thereby providing a second planarized surface (12b); the resulting structure is depicted in FIG. 15.

LIST OF REFERENCE NUMBERS (1) substrate
(2a) first diffusion barrier layer
(2b) second diffusion barrier layer
(2c) third diffusion barrier layer
(2d) fourth diffusion barrier layer
(3a) first metal layer
(3b) second metal layer
(4a) first dielectric material
(4b) second dielectric material
(4c) third dielectric material
(4d) fourth dielectric material
(5a) first patterned mask
(5b) second patterned mask
(5c) third patterned mask
(5r) masking material, flat photoresist layer
(6) patterned mask lines
(7) gaps
(8a) line structures from a first set
(8b) line structures of a second set
(9a) metal lines of a first set
(9b) metal lines of a second set
(10a) first dielectric barrier material
(10b) second dielectric barrier material
(11a) top portion of the second dielectric material
(11b) top portion of the fourth dielectric material
(12a) first planarized surface, composite dielectric top surface of the first entity
(12b) second planarized surface, composite dielectric top surface of the second entity
(13a) via in the patterned mask
(13b) via in the first dielectric material
(14) trench
(15) perforated (dielectric) surface
(16a) dielectric lines from a first set
(16b) dielectric lines from a second set
(17a) diffusion barrier lines of a first set
(17b) diffusion barrier lines of a second set
(18a) first entity
(18b) second entity
(18b,i) intermediate second entity
(19) top surface of the first set of line structures
(21a) conductive lines from a first set
(21b) conductive lines from a second set
(22) exposed portion of the first set of conductive line.
(24) conductive portion of the side surface of the line structure
(25) dielectric portion of the side surface of the line structure It is to be understood that although embodiments, specific constructions and configurations, as well as materials, have been discussed herein for devices according to the present disclosure, various changes or modifications in form and detail may be made without departing from the scope of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method of forming an interconnect structure, comprising the steps of:
    providing a first entity comprising:
        a first set of one or more line structures having a top surface, comprising:
            a first set of one or more conductive lines,
            a first set of one or more dielectric lines of width (w) made of a first dielectric material, aligned with and overlaying the first set of one or more conductive lines, and comprising the top surface,
        a second dielectric material of such a nature that the first dielectric material can be etched selectively with respect to the second dielectric material, the second dielectric material surrounding each line structure and having a top surface coplanar with the top surface of the one or more line structures;
    providing a patterned mask on the first entity, wherein the pattern comprises:
        at least one via exposing the whole width (w) of an underlying dielectric line of the first set of one or more dielectric lines, and/or
        at least one trench exposing the whole width (w) of at least one dielectric line of the first set of one or more dielectric lines;
    etching selectively the first dielectric material with respect to the second dielectric material through the patterned mask so as to form one or more vias in the first dielectric material, thereby exposing a portion of the set of one or more conductive lines; and
    removing the patterned mask, thereby uncovering a perforated surface.

2. The method according to claim 1, wherein the first set of line structures provided in step a have the first dielectric material exposed at the top surface thereof and have side surfaces comprising a conductive portion and a dielectric portion wherein at least the conductive portion is at least partially coated with a first dielectric barrier material, the first dielectric barrier material being such that the first dielectric material can be etched selectively with respect to the first dielectric barrier material.

3. The method according to claim 1, wherein the first set of conductive lines comprises:
    optionally a first set of diffusion barrier lines,
    a first set of metal lines aligned with and overlaying the first set of diffusion barrier lines if present, and
    optionally a second set of diffusion barrier lines aligned with and overlaying the first set of metal lines,
    wherein the first set of dielectric lines is aligned with and overlaying the second set of diffusion barrier lines if present or the first set of metal lines in absence of the second set of diffusion barrier lines, and
    wherein etching selectively exposes a portion of the second set of diffusion barrier lines if present or a portion of the first set of metal lines in absence of the second set of diffusion barrier lines.

4. The method according to claim 3, wherein providing the first entity (18a) comprises the steps of:
    providing a substrate;

optionally overlying the substrate (with a first diffusion barrier layer;
overlying a first metal layer on the first diffusion barrier layer if present or on the substrate if no first diffusion barrier layer is present;
optionally overlying the first metal layer with a second diffusion barrier layer;
overlying a layer of a first dielectric material on the second diffusion barrier layer if present or on the first metal layer if no second diffusion barrier layer is present;
providing a first patterned mask on the layer of a first dielectric material, wherein the pattern comprises lines separated by gaps;
etching the layer of a first dielectric material, the second diffusion barrier layer if present, the first metal layer, and the first diffusion barrier layer if present, through the first patterned mask, thereby forming a first set of line structures separated by gaps, the first set of line structures comprising a first set of metal lines;
removing the first patterned mask;
optionally coating the first set of line structures with a first dielectric barrier material so as to at least entirely coat all exposed surfaces of the first set of metal lines, the first dielectric barrier material being such that the first dielectric material can be etched selectively with respect to the first dielectric barrier material;
overlaying the first set of line structures and the first dielectric barrier material if present with a second dielectric material in such a way as to fill the gaps and as to cover entirely the first set of line structures and the first dielectric barrier material if present, wherein the second dielectric material is such that the first dielectric material can be etched selectively with respect to the second dielectric material, thereby providing an intermediate first entity; and
planarizing the intermediate first entity by removing a top portion thereof in such a way that the first dielectric material is exposed, thereby providing the first entity.

5. The method according to claim 3, wherein the metal comprises copper and wherein all optional steps are performed.

6. The method according to claim 1, further comprising the steps of:
providing a second entity on the first entity, the second entity comprising:
a second set of line structures at an angle relative to the first set of line structures, wherein at least one of the line structures is aligned with at least one of the one or more vias and penetrating the at least one of the one or more vias so as to connect with the exposed portion of the first set of conductive lines, the second set of line structures comprising:
a second set of conductive lines wherein at least one of the conductive lines is aligned with at least one of the one or more vias and penetrating at least one of the one or more vias, and
a second set of dielectric lines made of a third dielectric material and aligned with and overlaying the second set of conductive lines; and
gaps separating the line structures and filled with a fourth dielectric material of such a nature that the third dielectric material can be etched selectively with respect to the fourth dielectric material.

7. The method according to claim 6, wherein providing the second entity comprises:

optionally overlying the perforated surface with a third diffusion barrier layer penetrating the one or more vias and connecting with the exposed portion of the first set of conductive lines;
overlying a second metal layer on the third diffusion barrier layer if present or on the perforated surface, so as to fill the one or more vias and connect with the exposed portion of the first set of conductive lines;
optionally overlying the second metal layer with a fourth diffusion barrier layer;
overlying a layer of a third dielectric material on the fourth diffusion barrier layer if present or on the second metal layer if no fourth diffusion barrier layer is present,
providing a third patterned mask on the layer of a third dielectric material, wherein the pattern comprises lines separated by gaps, wherein the lines are at an angle relative to the first set of line structures, wherein at least one of the line structures is aligned with at least one of the one or more vias;
etching the layer of a third dielectric material, the fourth diffusion barrier layer if present, the second metal layer, and the third diffusion barrier layer if present, through the third patterned mask, thereby forming the second set of line structures separated by gaps;
removing the third patterned mask;
optionally coating the second set of line structures with a second dielectric barrier material so as to at least entirely coat all exposed surfaces of the second set of conductive lines, the second dielectric barrier material being such that the third dielectric material can be etched selectively with respect to the second dielectric barrier material;
overlaying the second set of line structures and the second dielectric barrier material if present with a fourth dielectric material in such a way as to fill the gaps and as to cover entirely the second set of line structures and the second dielectric barrier material if present, wherein the fourth dielectric material is such that the third dielectric material can be etched selectively with respect to the fourth dielectric material, thereby providing an intermediate second entity; and
planarizing the intermediate second entity by removing a top portion thereof in such a way that the third dielectric material is exposed, thereby providing the second entity.

8. The method according to claim 7, wherein etching through the second metal layer and the third diffusion barrier layer if present is continued until:
away from the one or more vias, it exposes either
the top surface of the second dielectric material underlying the second metal layer, or
the third diffusion barrier layer if present; and
in the one or more vias, it exposes the second barrier layer if present or a metal line.

9. The interconnect structure according to claim 8, further comprising a second set of line structures at an angle relative to the first set of line structures, wherein at least one of the line structures is aligned with at least one of the one or more vias and penetrating the one of the one or more vias so as to connect with the exposed portion of the first set of conductive lines, the line structures being separated by gaps, the second set of line structures comprising:
a second set of conductive lines penetrating the one or more vias, a second set of dielectric lines made of a third dielectric material and aligned with and overlaying the second set of conductive lines,
wherein a fourth dielectric material, of such a nature that the third dielectric material can be etched selectively with respect to the fourth dielectric material, surrounds each line structure and has a top surface coplanar with the top surface of the line structures of the second set.

10. The interconnect structure according to claim 9, wherein the second set of line structures is perpendicular to the first set of line structures.

11. The method according to claim 6, wherein the second set of line structures is perpendicular to the first set of line structures.

12. An interconnect structure comprising:
a first set of one or more line structures comprising:
a first set of one or more conductive lines,
a first set of one or more dielectric lines made of a first dielectric material and aligned with and overlaying the first set of one or more conductive lines; and
a second dielectric material of such a nature that the first dielectric material can be etched selectively with respect to the second dielectric material, the second dielectric material surrounding each line structure and having a top surface coplanar with the top surface of the line structures, wherein the first set of dielectric lines is perforated with one or more vias exposing a portion of the first set of conductive lines.

13. The interconnect structure according to claim 12, wherein the first set of conductive lines comprises:
optionally a first set of diffusion barrier lines,
a first set of metal lines, and
optionally a second set of diffusion barrier lines,
wherein when the first set of diffusion barrier lines is present, it is aligned with and overlaid by the first set of metal lines, wherein the second set of diffusion barrier lines if present is aligned with and is overlying the first set of metal lines, wherein the first set of dielectric lines is aligned with and is overlying the second set of barrier lines if present or the first set of metal lines in absence of the second set of barrier lines, wherein the first set of dielectric lines is perforated with one or more vias exposing a portion of the first set of conductive lines.

14. The interconnect structure according to claim 13, wherein the first set of line structures have the first dielectric material exposed at the top surface thereof and have side surfaces comprising a conductive portion and a dielectric portion, wherein at least part of the conductive portion has a coating of a first dielectric barrier material thereon, the first dielectric barrier material being such that the first dielectric material can be etched selectively with respect to the first dielectric barrier material.

15. The interconnect structure according to claim 14, wherein the first set of line structures is coated with the dielectric barrier material so as to at least entirely coat all exposed surfaces of the first set of metal lines.

16. The interconnect structure according to claim 12, wherein the metal comprises copper and wherein the interconnect structure includes all optional features.

* * * * *